United States Patent [19]

Shealy et al.

[11] Patent Number: 5,949,182

[45] Date of Patent: Sep. 7, 1999

[54] LIGHT-EMITTING, NANOMETER SCALE, MICROMACHINED SILICON TIPS

[75] Inventors: J. Richard Shealy; Noel C. MacDonald, both of Ithaca, N.Y.

[73] Assignee: Cornell Research Foundation, Inc., Ithaca, N.Y.

[21] Appl. No.: 08/660,074

[22] Filed: Jun. 3, 1996

[51] Int. Cl.[6] .................................................... H01J 1/30
[52] U.S. Cl. ................... 313/345; 313/346 R; 313/309; 313/336; 313/351; 313/310
[58] Field of Search ................................... 313/309, 336, 313/351, 310, 494, 346 R, 345

[56] References Cited

U.S. PATENT DOCUMENTS

| | | |
|---|---|---|
| 3,665,241 | 5/1972 | Spindt et al. . |
| 3,755,704 | 8/1973 | Spindt et al. . |
| 3,812,559 | 5/1974 | Spindt et al. . |
| 4,513,308 | 4/1985 | Greene et al. ........................ 313/309 |
| 5,064,396 | 11/1991 | Spindt . |
| 5,186,670 | 2/1993 | Doan et al. . |
| 5,199,917 | 4/1993 | MacDonald et al. . |
| 5,229,331 | 7/1993 | Doan et al. . |
| 5,232,549 | 8/1993 | Cathey et al. . |
| 5,316,979 | 5/1994 | MacDonald et al. . |
| 5,329,207 | 7/1994 | Cathey et al. . |
| 5,363,021 | 11/1994 | MacDonald . |
| 5,438,240 | 8/1995 | Cathey et al. . |
| 5,448,132 | 9/1995 | Komatsu . |
| 5,615,143 | 3/1997 | MacDonald ........................... 365/112 |

OTHER PUBLICATIONS

Zhang, et al., "Integrated Silicon Process for Microdynamic Vacuum Field Emission Cathodes", J. Vac. Sci. Technol., Nov./Dec. 1993, pp. 2538–2543.

Spallas, et al., "Self-Aligned Silicon Field Emission Cathode Arrays Formed by Selective, Lateral Thermal Oxidation of Silicon", J. Vac. Sci. Technol., Mar./Apr. 1993, pp. 437–440.

Shealy, "Characterization of AlGaAs/GaAs Heterostructures Grown In A Multichamber OMVPE Apparatus", J. of Crystal Growth 87 (1988), pp. 350–356.

Keeffe, et al., "Surface Self-Diffusion on Si from the Evolution of Periodic Atomic Step Arrays", J. Phys. Chem. Solids, vol. 55, No. 10, 1994, pp. 965–973.

Shealy, "Applied Physics Letters", Appl. Phys. Lett. 48 (14), Apr. 1986, pp. 925–927.

*Primary Examiner*—Ashok Patel
*Attorney, Agent, or Firm*—Jones, Tullar & Cooper PC

[57] ABSTRACT

Nanometer-scale field emitter tips are fabricated on a single crystal silicon substrate and an optically active semiconductive material is deposited on the tip. A bias voltage is connected between the semiconductor and the substrate to cause the optically active material to emit light.

32 Claims, 5 Drawing Sheets

LIGHT-EMITTING, NANOMETER SCALE, MICROMACHINED SILICON TIPS

BACKGROUND OF THE INVENTION

The present invention relates, in general, to flat panel image displays, and more particularly to solid-state structures for generating bright, luminous pixels which may be used, for example, to produce images on flat panel surfaces.

Conventional cathode ray tubes utilize a scanning electron beam from an electron gun to impinge on phosphors on a display screen. The electron beam causes the phosphors to release light which is transmitted through the screen to the viewer. Such screens are widely used, but since they are relatively large and utilize relatively high voltages and complex control circuitry, they are not suitable for many applications.

Flat panel displays have been developed which combine the phosphor technology of cathode-ray tubes with integrated circuit technology to create thin, high-resolution displays wherein each pixel is activated by its own electron emitter. This type of display is becoming increasingly important in appliances requiring lightweight portable image display screens. However, such devices require a relatively high voltage differential between the cathode emitting surface and the phosphor-coated display screen surface. Since these surfaces must be close together in order to maintain the desired structural thinness and the high image resolution required in such display devices, problems of electrical breakdown are encountered. Furthermore, such devices must be operated under a vacuum, and the high pressure differential that exists between external atmospheric pressure and the pressure within the evacuated chamber creates additional problems. Thus, there is a need for an improved structure and method for obtaining bright, luminous pixels in flat panel displays while eliminating the complex phosphors, the high vacuum, high voltage requirements, and the complex beam control circuits required in prior devices.

SUMMARY OF THE INVENTION

Briefly, the present invention is directed to a new and unique approach to the art of flat panel displays. In accordance with the invention, an array of micromachined field emitters is provided on a generally planar surface. These emitters, which each have a tip having a radius of curvature of approximately 10 to 20 nm, and can be spaced apart by as little about 3 to 6 micrometers tip-to-tip or less. The emitters are of substantially uniform heights and diameters and may be fabricated in large arrays. Each emitter tip is individually coated with an optically active, light-emitting material to produce a direct bandgap compound semiconductor on each tip. Each semiconductor is individually activated by energization of its corresponding tip which causes the activated material to become light emitting, with the color of light so emitted being determined by the material used on the tip. This structure eliminates the need for the phosphors, high vacuums, and high voltage differentials normally associated with flat panel displays, while producing an image display of high resolution and low cost, utilizing a very large number of color-controlled pixels.

In accordance with the invention, an array of nanometer-scale field emitters is fabricated to provide small-volume tips, or "needles" which allow nucleation of a crystal structure. In one example of the invention, the tips are fabricated from a single-crystal silicon substrate, although other substrates such as polycrystalline materials can be used. The array of tips is coated with silicon nitride ($Si_3N_4$), is masked, and is etched to expose bare silicon at the emitter tips. A direct bandgap structure is then selectively grown on the bare silicon regions; for example, an organometallic vapor phase epitaxy of GaInP, for a red pixel, GaInN for a green pixel, and other materials for other colors may be carried out. Thereafter, metallization of the tips and formation of interconnects using standard processing methods are carried out, with the interconnects providing conductive paths for controlling the energization of the tips either individually or in groups to produce light emission.

Photon generation in the direct bandgap structure is produced by one of three mechanisms, each requiring that a different structure be grown on the tip array. In the first mechanism, a p-type direct bandgap structure is provided on the tip, and field emission of electrons is produced directly into the conduction band of the structure, followed by band-to-band recombination for the emission of light. In the second mechanism, a direct bandgap p-n junction is formed on the tip, with carrier injection and recombination being produced under forward bias to emit light. In the third mechanism, an undoped direct bandgap material is formed on the tip, causing electron-hole pair generation as a result of field emission under high forward bias of energetic electrons into this material, followed by thermalization and recombination. The first two of these mechanisms requires much lower operating voltages than does the third. Furthermore, the first two have a higher overall quantum efficiency, and are compatible with conventional CMOS technology.

In one process scheme, lateral oxidation micromachining is utilized in the fabrication of the tips. This process, which permits fabrication of nanometer-scale tips, for example on movable microelectromechanical (MEM) structures in single crystal silicon, is described in U.S. Ser. No. 08/069,725 U.S. Pat. No. 5,536,988 of Z. Lisa Zhang and Noel C. MacDonald, filed Jun. 1, 1993, and is further described in "Integrated Silicon Process for Microdynamic Vacuum Field Emission Cathodes," Z. Lisa Zhang and Noel C. MacDonald, J. Vac. Sci. Technol. B 11(6) Nov/Dec 1993, pp 2538–2543, the disclosures of which are hereby incorporated herein by reference. The tips produced by this process are then covered by a suitable semiconductor material to provide light-emitting tips which may be usable in a wide variety of display applications. By using the process described in Ser. No. 08/069,725, U.S. Pat. No. 5,536,988 these tips are movable to provide additional applications.

Although the lateral oxidation process is preferred in many applications, it will be understood that tips suitable for receiving semiconductor materials for light emission may be fabricated by other processes, such as the process described in U.S. Pat. No. 5,329,207 or in U.S. Pat. No. 5,232,549, for example.

Although a single light-emitting material can be deposited on all of the tips in an array for selective illumination to produce a monochrome image of varying intensity, in the preferred form of the invention three deposition cycles utilizing suitable pattern masks are used to deposit red, green or blue light-emitting materials on selected tips. Metallization and interconnect steps permit connection of the tips to suitable circuits for selective energization of the tips to provide color control for displayed images. In a preferred form of the invention, multiple tips are grouped to form color pixels. Thus, for example, multiple red-emitting tips, multiple green-emitting tips and multiple blue-emitting tips are grouped to form a single pixel. The multiple tips of a given color provide redundancy as well as intensity control, since each tip is individually controllable, while the overall color of the pixel is selected by controlling which tips in the three sets of primary color tips are excited. Thus, the color and intensity of light emitted by a pixel can be regulated.

BRIEF DESCRIPTION OF THE DRAWINGS

The foregoing, and additional objects, features and advantages of the present invention will become apparent to those of skill in the art from the following detailed description of preferred embodiments, taken in conjunction with the accompanying drawings in which.

DESCRIPTION OF PREFERRED EMBODIMENTS

Figure 1:
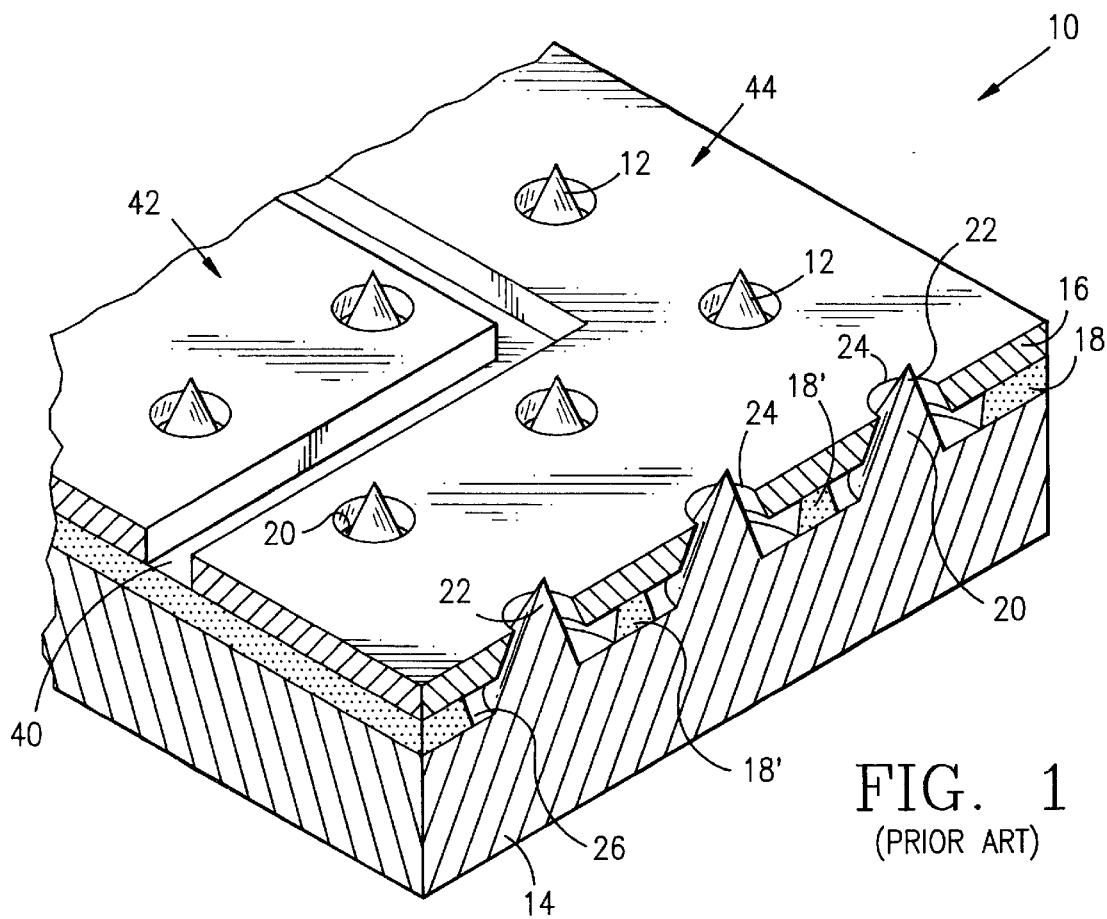
FIG. 1 is a diagrammatic perspective view in partial section of an emitter array suitable for use in the present invention.

In accordance with one embodiment of the present invention, micro-emitter tips are formed on a substrate utilizing the lateral oxidation process described above, and in an array such as that described in U.S. Pat. No. 5,199,917, to Noel C. MacDonald and James P. Spallas, and as also described in "Self-Aligned Silicon Field Emission Cathode Arrays formed by Selective, Lateral Thermal Oxidation of Silicon," J. P. Spallas, J. H. Das, and N. C. MacDonald, J.Vac.Sci Technol. B 11(2), Mar./Apr. 1993, pp 437–440, the disclosures of which are hereby incorporated herein by reference. Such a prior ant array is illustrated generally at 10 in FIG. 1 as incorporating a multiplicity of closely spaced emitters such as the emitters 12 which are fabricated from, and thus are integral with, a substrate 14. The substrate preferably is silicon and in the most preferred embodiment of the invention is single crystal silicon and the lateral oxidation process described above is used Alternatively, tips fabricated in accordance with U.S. Pat. Nos. 5,329,207 and 5,232,549 may be used. In the embodiment of FIG. 1, the emitters, however they are fabricated, are surrounded by a self-aligned electrode in the form of a metal layer 16 for controlling electron emission.

The emitters and their aligned electrodes may be produced in accordance with U.S. Pat. No. 5,199,917, which describes a fabrication process wherein a plurality of silicon islands, which are surrounded by channels or trenches, are formed in the substrate 14 by a masking and etching process. The islands are supported by corresponding vertical, inwardly tapered silicon pedestals which extend upwardly from, and are integral with, the substrate, the pedestals having a narrow neck portion where they join their corresponding islands. Subsequent oxidation of the pedestals separates the silicon in the islands from the silicon in the pedestals at the neck portion, with the oxide maintaining the islands in place. This oxidation step shapes the upper part of the tapered pedestal and the lower part of the island to form lower and upper opposed, spaced-apart and aligned tips in the silicon contained in the pedestals and in their corresponding islands, respectively.

More particularly, and as described in detail in U.S. Pat. No. 5,199,917, the oxidation step provides a uniform layer 18 of oxide on the vertical surfaces of the pedestals and on the horizontal surface of the substrate between adjacent pedestals. The oxidation of the tapered pedestals advances uniformly from all sides of the pedestal so that the silicon material "shrinks" uniformly during this process, with the process being continued until all the silicon in the region of the narrow neck portion has been oxidized. As a result, the silicon material under the oxide layer forms a tapered, preferably conical silicon emitter 12 having a lower pedestal portion 20 which terminates in a small tip 22 having a diameter at its smallest end of about 20 nm. The oxidation is uniform throughout the array so that if the pedestals are fabricated so as to have substantially equal diameters, all the resulting emitters will be substantially the same size with substantially the same tip diameter.

In the process described in U.S. Pat. No. 5,199,917, the gate electrode material 16 is deposited on the horizontal surface of the oxide layer 18 between the emitters, with the metal layer having apertures 24 surrounding the individual tips 22. These apertures are produced by the presence of the oxide layer on the vertical pedestal walls. The thickness of the oxide layer spaces the metal from the pedestal walls, so when the oxide is removed, the apertures are formed. Since layer 18 is uniform on the emitters at the time of metallization, the apertures 24 are formed in the metal in exact coaxial alignment with the tips 22, and thus are "self-aligned." In addition, the metal is spaced above the surface of the substrate by the thickness of the oxide layer 18.

The oxide layer 18 is then etched to lift off the islands and their included upper tips and further to remove the layer 18 of oxide formed around the lower tips and on the pedestals to thereby expose the cone-shaped silicon tapered emitters 12. The oxide etching step also removes, through apertures 24, selected portion of the oxide from the substrate surface by undercutting the gate electrode metal 16 adjacent to emitters 12, as illustrated at 26 in FIG. 1. This undercutting leaves oxide support pillars 18' between adjacent emitters and beneath the gate metal 16 to support the gate metal layer and to hold it securely in place so that the apertures remain in alignment with the emitter tips.

Figure 2:
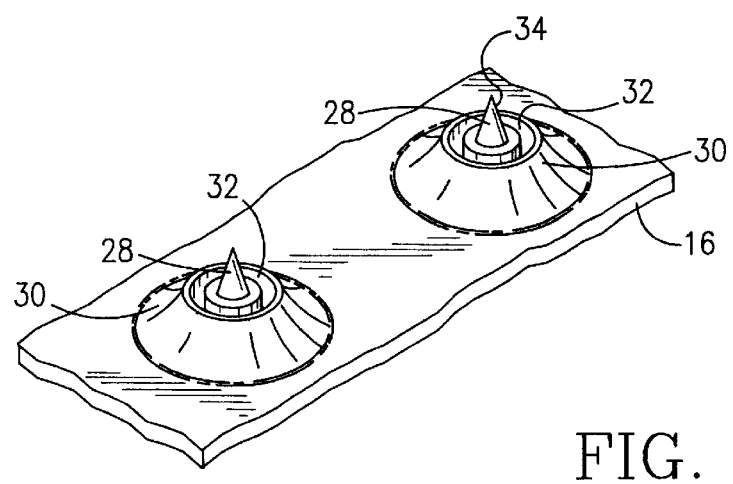
FIG. 2 is a partial diagrammatic perspective view of a modified form of the emitter array of FIG. 1.

In another embodiment of the invention, disclosed in U.S. Pat. No. 5,199,917 illustrated in FIG. 2, the gate electrode layer 16 is not only deposited on the horizontal surface of the oxide between the tip pedestals, but in addition is deposited, as by sputter deposition, on the sides of the tapered pedestals so that the metal extends upwardly to cover them. An aluminum mask is then deposited over the gate electrode layer to define an aperture surrounding each tip, and a plasma etch removes the gate metal layer in the defined apertures. Thereafter, an etching step removes the oxide layer to lift off the islands, as in the structure of FIG. 1, leaving exposed conical emitters 28 surrounded by corresponding upwardly sloping gate electrodes 30. Each gate electrode 30, or "dimple," has an aperture 32 which is coaxially aligned with, and thus is concentric to, its corresponding emitter 28, with the diameter of the aperture being selected by the masking step to be as small as desired. The size of the aperture is limited only by the minimum thickness of the oxide at its narrowest part, in the region of the top end, or tip 34, of emitter 28.

It will be understood that the nanometer scale silicon emitters 20 or 28 can be made by processes other than the lateral oxidation process described above. The principal requirement is that the tips be of very small diameter and generally cone-shaped or cylindrical with cone-shaped tips. The small diameter provides a small volume emitter structure which allows the lattice structure of the silicon to deform during deposition of the light-emitting material. It is this deformation which is believed to allow nucleation of the semiconductor light-emitting crystal on the silicon tips.

As further illustrated in FIG. 1, the gate electrode metal layer 16 can be patterned in conventional manner to form contact pads for connecting the electrodes to external circuitry. In addition, boundaries, such as a boundary channel 40, can be patterned for separating the metal layer into areas or regions such as the regions 42 and 44. These regions each encompass groups of emitters within the overall array 10 for controlling the emission from those groups, as by means of suitable control circuitry (not shown) connected to each region.

Figure 3:
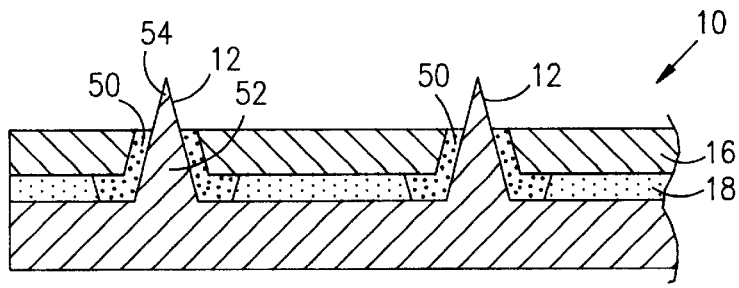
FIG. 3 is a cross-sectional view of a part of the emitter array of FIG. 1, illustrating a process of fabricating light-emitting tips in accordance with the present invention.

In accordance with the present invention, the tips of emitters fabricated in accordance with the foregoing selective lateral oxidation process or other tip fabrication process were further treated by depositing a coating 50 of silicon nitride ($Si_3N_4$) on the lower pedestal portion 52 of the emitters 12, as illustrated in cross-section in FIG. 3 to limit the deposition of light-emitting material to the emitter tips. Accordingly, the nitride layer 50 was first deposited to cover the entire wafer 10, and was then masked and selectively etched to expose the tip portions 54 of the emitters, generally as indicated. Thereafter, an optically active material 56 (FIG. 4) was selectively grown or deposited on the exposed tips 54. This semiconductor material may be, for example, a direct bandgap semiconductor such as GaInP which may be grown using a conventional flow modulation technique in an organometallic vapor phase epitaxial reactor. This reactor used in one experiment was a conventional multi-deposition zone reactor utilizing a vertical barrel design operating in a reduced hydrogen pressure (76 Torr). In an experimental production of light-emitting tips in accordance with the invention, the emitter tips were subjected to alternating exposures of the group III reactant species triethylgallium and trimethylindium, and the group V species phosphine, to produce the GaInP layer 56. A detailed description of the epitaxial deposition process is described by M. J. Matragranno, V. Krishnamoorthy, J. R. Shealy, and D. G. Ast, Journal of Crystal Growth 142, 275 (1994) and by B. L. Pitts, D. T. Emerson and J. R. Shealy, Applied Physics Letters 61, 2054 (1993).

In the experimental process, tip structures were heated to 750° C. in a hydrogen atmosphere for up to five minutes. The substrate temperature was then reduced to 700° C. for the GaInP deposition. The gas phase stoichiometry (V/III ratio) was 120 and the gas velocity was roughly 30 CM/SEC. The growth rate and the alloy composition x of the $Ga_xIn_{1-x}P$ was measured on a GaAs control sample, and showed a growth rate of 0.8 micrometers per hour. Structures on planar substrates were characterized by X-ray diffraction and all samples were examined by scanning electron microscopy (SEM), cathodoluminescence (CL), and photoluminescence (PL).

In order to gain insight on the nucleation process in this experiment, short growth runs were carried out with GaInP deposition on silicon tips, with deposition times ranging from one to five minutes in duration. It was found that the one minute deposition cycle produced nucleation on the emitter tip and its supporting structure, with the silicon nitride coated region remaining completely free of deposition. It appeared that nucleation began on the bare silicon tip with the tip structure providing a growth rate enhancement (over planar epitaxy) estimated to be in excess of 25 to 1 during the first minute of growth. Cathodoluminescence testing of the GaInP coated silicon tip at room temperature showed intense emission, with the emission wavelength being roughly 690 nm, as observed in room temperature photoluminescence spectra taken under 10 mW of unfocused $Ar^+$ laser light (488 nm).

It was noted in the experiment that the peak emission wavelength on the planar GaAs control sample was 620 nm, indicating that the InP preferentially nucleates on the silicon tip structure, rather than GaP. It was also clear from testing that very brief growth cycles are required to produce the GaInP tips, as both three and five minute growth periods produced weaker emission in both the cathodoluminescence and photoluminescence testing. The cathodoluminescence images also illustrated some photon emission from the deposition on the silicon nitride coated surfaces for the three and five minute growth periods. It was noted that eventually the entire nitride-coated surface between the tips gets coated by the GaInP deposition process, again indicating the desirability of the shorter deposition period.

Figure 4:
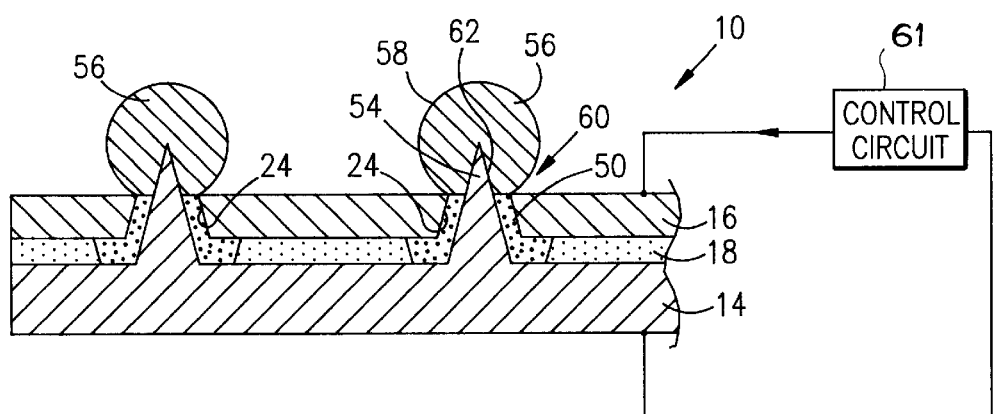
FIG. 4 illustrates a later stage of the process of FIG. 3 as well as the resulting bandgap structure for light emission.

In the embodiment of FIG. 4, the deposition of the optically active, light emitting material 56 was continued sufficiently long to enable the material 56 to build to a thickness equal to or greater than the width of aperture 24, so that its outer surface 58 came into contact with the metal layer 16 around the periphery of the aperture, as generally indicated at 60. This effectively metallized the material 56 so that it could be connected to suitable control circuitry 61, in the manner described with respect to FIG. 1. In this way, a suitable bias voltage could be applied between metal layer 16 and substrate 14. Such a bias voltage $V_a$ was applied across the barrier 62 between the GaInP layer 56 and the silicon tip 54, as illustrated in the energy band diagram generally indicated at 64 in FIG. 5. Because of the small size of the tip, the bias provides a sufficiently high voltage potential across the compound semiconductor to cause tunneling of electrons from the silicon layer into the optically active material 56, to thereby energize material 56. Recombination of electron-hole pairs in material 56 produces output light 65 of a wavelength corresponding to the particular direct bandgap material. Since the segmented metal electrode regions 42, 44, etc. in the emitter array can be selectively addressed, the coated, light-emitting tips can also be selectively addressed for energization in controllable patterns for image display.

Figure 5:
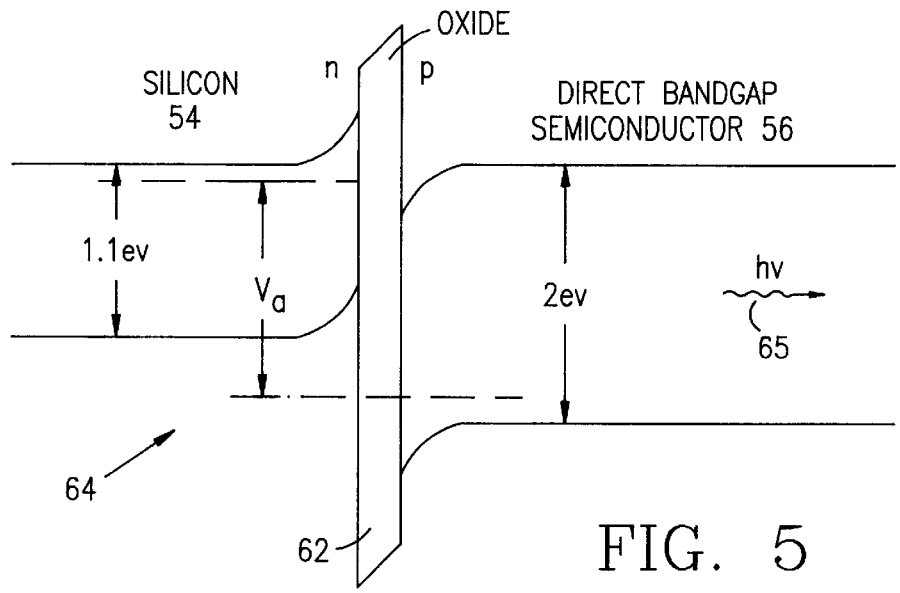
FIG. 5 is a bandgap diagram of the structure of FIG. 4.

Although the energy band diagram of FIG. 5 illustrates the presence of an oxide layer at barrier 62, it is noted that this layer is not essential, and may be eliminated from the barrier, if desired.

Figure 6:
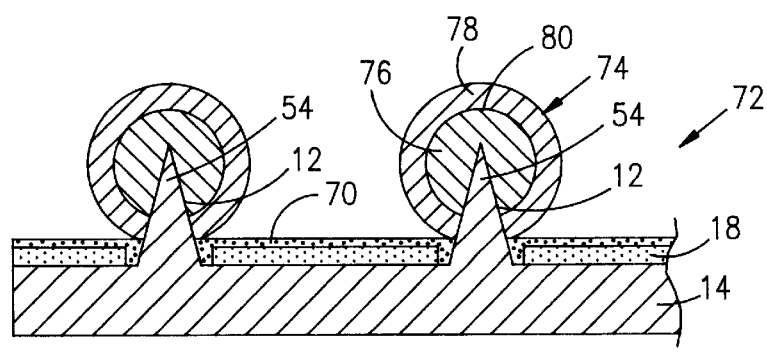
FIG. 6 illustrates a modification of the process of FIGS. 3 and 4 and the resulting p-n junction structure for light emission.
Figure 8:
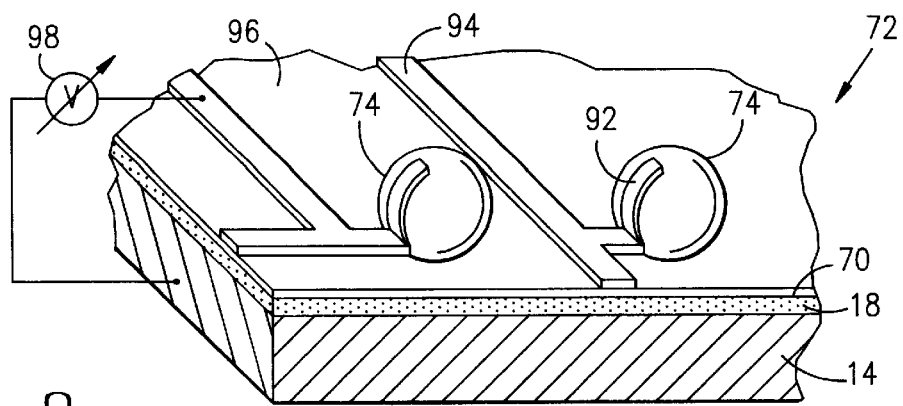
FIG. 8 illustrates a metallized light emitter in accordance with the invention.
Figure 7:
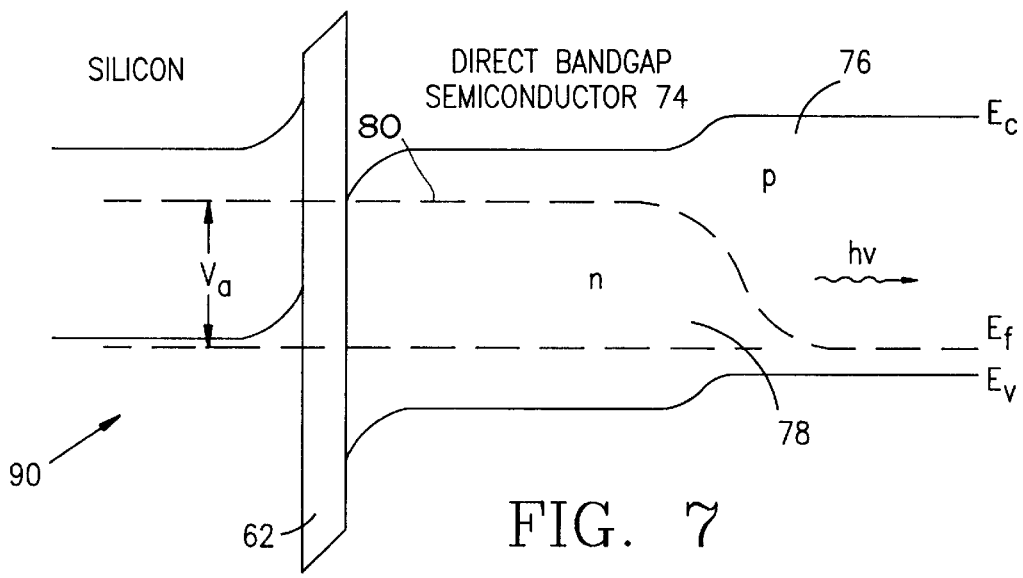
FIG. 7 is a bandgap diagram of the structure of FIG. 6.

A modification of the foregoing process is illustrated in FIGS. 6, 7 and 8, wherein emitters 12 (FIG. 6) are fabricated from a silicon substrate 14. The emitters preferably are single crystal silicon, in accordance with the thermal oxidation process described above. The top surface of the substrate between the tips is covered by an oxide layer 18, such as silicon dioxide, as previously described. However, in this embodiment the metal layer 16 is omitted and in its place a layer 70 of silicon nitride is applied to provide a tip-carrying wafer 72 (FIG. 6). The wafer is suitably masked and the layer 70 selectively removed from the emitter tip portions 54, as described above. Thereafter, an optically active material 74 is selectively grown or deposited on the bare silicon surface of the tip. The material 74 is a direct bandgap structure which may be the p-type GaInP material described above with respect to FIG. 4. In the illustrated embodiment of FIG. 6, however, the optically active material consists of a first layer of p-type material 76 and a second layer 78 of n-type material, with a junction 80 formed therebetween to provide a tunneling contact between the layers. The bandgap for this material is illustrated generally at 90 in FIG. 7.

Since the embodiment of FIG. 6 does not include a metal layer, the top surfaces of the optically active material 74 and the insulating layer 70 are then metallized and, through conventional masking and etching processes, suitable metal contacts 92 and interconnect strips 94 are fabricated, for example in the manner as illustrated in FIG. 8. These metal strips and contacts, which are merely exemplary, serve to interconnect selected light emitters with each other and/or with a source of variable control voltage 98 for controlling light emission from individual emitters and/or groups of emitters.

The p-type direct bandgap material of FIGS. 4 and 5 operates by field emission of electrons directly into the conduction band of the p-type bandgap structure. This is followed by band-to-band recombination and the generation of visible wavelength photons 65, as explained above. Because the volume of silicon in each emitter tip is so small, lattice matching is not important so the semiconductor material will grow on the bare silicon material, with the subsequent application of bias potentials serving to offset the conduction bands in the materials and to provide light emission. A bias level of only a few volts is sufficient to produce this result.

The direct bandgap p-n junction of FIGS. 6 and 7 formed on the emitter tips utilizes carrier injection and recombination under a forward bias to obtain electron-hole generation and recombination with the consequent emission of light.

A third option is to utilize an undoped direct bandgap material in the structure of FIG. 4 and to operate the device under a high forward bias to inject energetic electrons into the bandgap material. Such electrons collide with the lattice structure of the material to produce electron-hole pairs which recombine to emit light. The foregoing processes all provide coating of emitter tips and subsequent metallization to permit internal field emission of electrons into a bandgap structure to produce light emission in nanometer-scale addressable emitter tip structures for optical image production.

Figure 9:
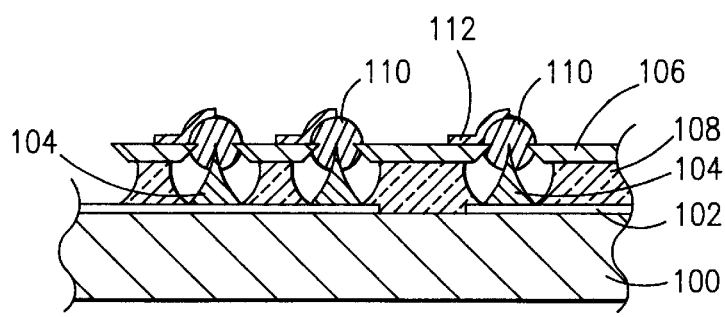
FIG. 9 is a cross-sectional partial view of an alternative emitter structure.

Although the metallization of the structure of FIG. 4 is through contact between the light-emitting material and a preexisting metal layer, it will be apparent that the light emitting material illustrated in that figure can be metalized in the manner illustrated in FIG. 8 if desired. Similarly, the p-n junction bandgap material of FIG. 6 can be metalized through connection to a pre-existing metal layer such as the layer 16 of FIG. 4, if desired. Another alternative is illustrated in FIG. 9, wherein a polysilicon layer 100 serves as a substrate onto which a conductive layer 102 of doped polycrystalline polysilicon has been deposited. At each field emission site, conical micro-cathodes 104 are constructed on the top surface of the substrate to serve as emitters. A low potential anode gate structure 106 surrounds the emitters so that a potential difference between gate 106 and cathode 104 causes a stream of electrons to be emitted toward a nearby screen anode from each emitter. The gate structure 106 is supported by a dielectric insulating layer 108 which has openings at the field emitter sites. Such a polycrystalline structure may be similar to that described in U.S. Pat. No. 5,329,207.

The silicon emitters 104 are fabricated on the substrate through known masking and etching techniques, and thereafter a direct bandgap semiconductor material 110 may be grown on the emitter tips in the manner discussed above with respect to FIGS. 4 and 6. The bandgap material may then be electrically connected to control circuitry such as a suitable bias source by way of metal lines 112 deposited on the surface of anode layer 106 for direct connection to the anode. If desired, an electrically insulating layer can first be placed on the top surface of the anode, followed by selective metallization to connect the band gap material to suitable control circuits.

Figure 10:
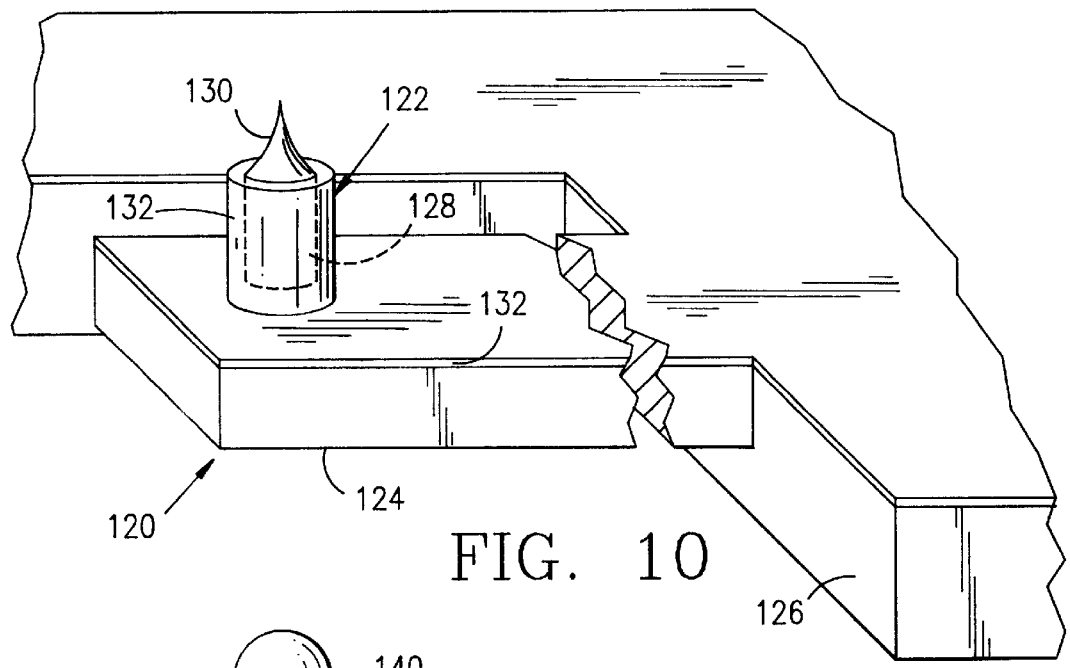
FIGS. 10–12 illustrate a process for producing a light-emitting movable tip in a microelectromechanical structure.
Figure 11:
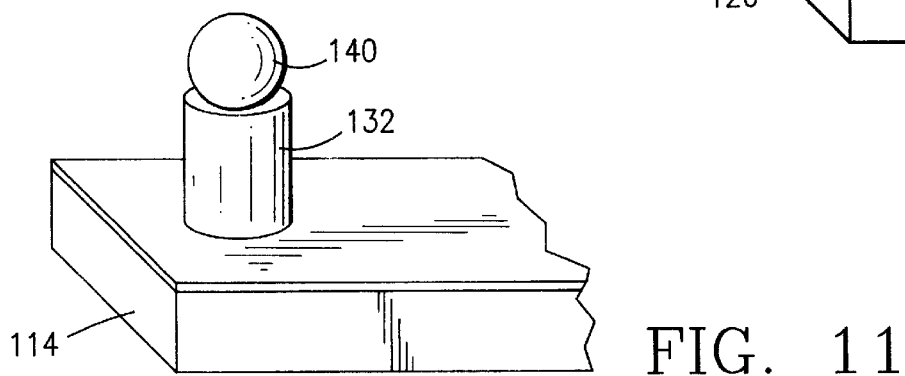
Figure 12:
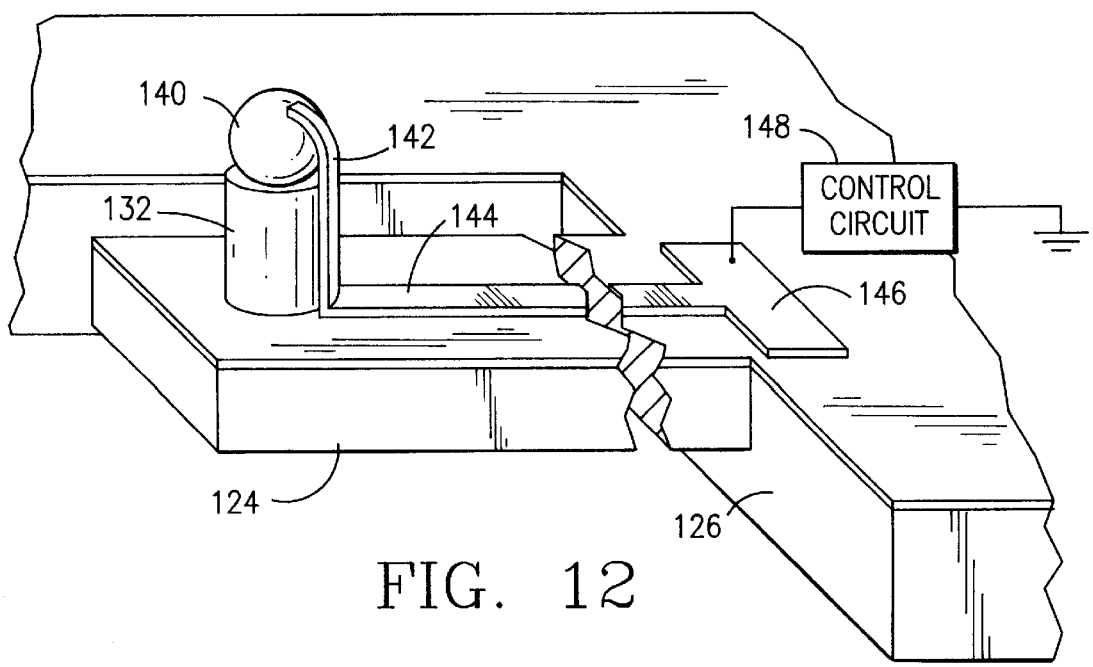

A light emitter, or an array of emitters, can be mounted on a stationary substrate for use, for example, in conventional image displays, or may be fabricated on a movable structure such as that generally indicated at 120 in FIG. 10. Although a single emitter 122 is there illustrated, it will be understood that this may be representative of an emitter array. Thus, one or more emitters 122 are fabricated on a released, moveable silicon beam 124 which may, for example, be cantilevered or otherwise secured to a silicon substrate 126. The cantilevered beam 124 is representative of released moveable beams such as the structure described and illustrated in the above-mentioned U.S. Ser. No. 08/069,725. The emitter 122 includes a pedestal portion 128 and a tip portion 120 fabricated integrally with the released structure 124. In accordance with the present invention, the top of substrate 126 and the pedestal portion 128 of the emitter are first coated with a silicon nitride layer 132 and thereafter, as illustrated in FIG. 11, a light-emitting bandgap structure 140 is selectively grown on the tip 130. As described above, this bandgap structure can be a p-type material such as that described with respect to FIG. 4, a p-n type material such as that described with respect to FIG. 6, or can be an undoped direct bandgap material As illustrated in FIG. 12, the bandgap material 140 is metalized in conventional manner to produce a contact strip 142 and an interconnect strip 144 leading to a contact pad 146 on the surface of the insulating layer 132 or substrate 126 for connection to a control circuit 148 such as a source of bias voltage. The emitter tips thus are mounted for selective motion with respect to the substrate and are connected for selective illumination to provide a moveable and controllable light source.

Although the foregoing description refers to the light emitting material on the emitters as being gallium indium phosphide (GaInP), it will be understood that other wide bandgap materials such as GaInN can be deposited. Such other materials may be selected to emit light in other portions of the spectrum so that by selectively depositing different materials on specified tips or groups of tips on a wafer and selectively controlling the emission therefrom, red, green and blue pixels, for example, of controllable intensity can be fabricated on the same silicon substrate. This will provide a high resolution flat panel display in color, and on a silicon substrate so that the device is compatible with conventional CMOS technology to enable the control circuits, such as circuits 61 in FIG. 4 and 148 in FIG. 12, to be fabricated in or on the substrates.

Figure 13:
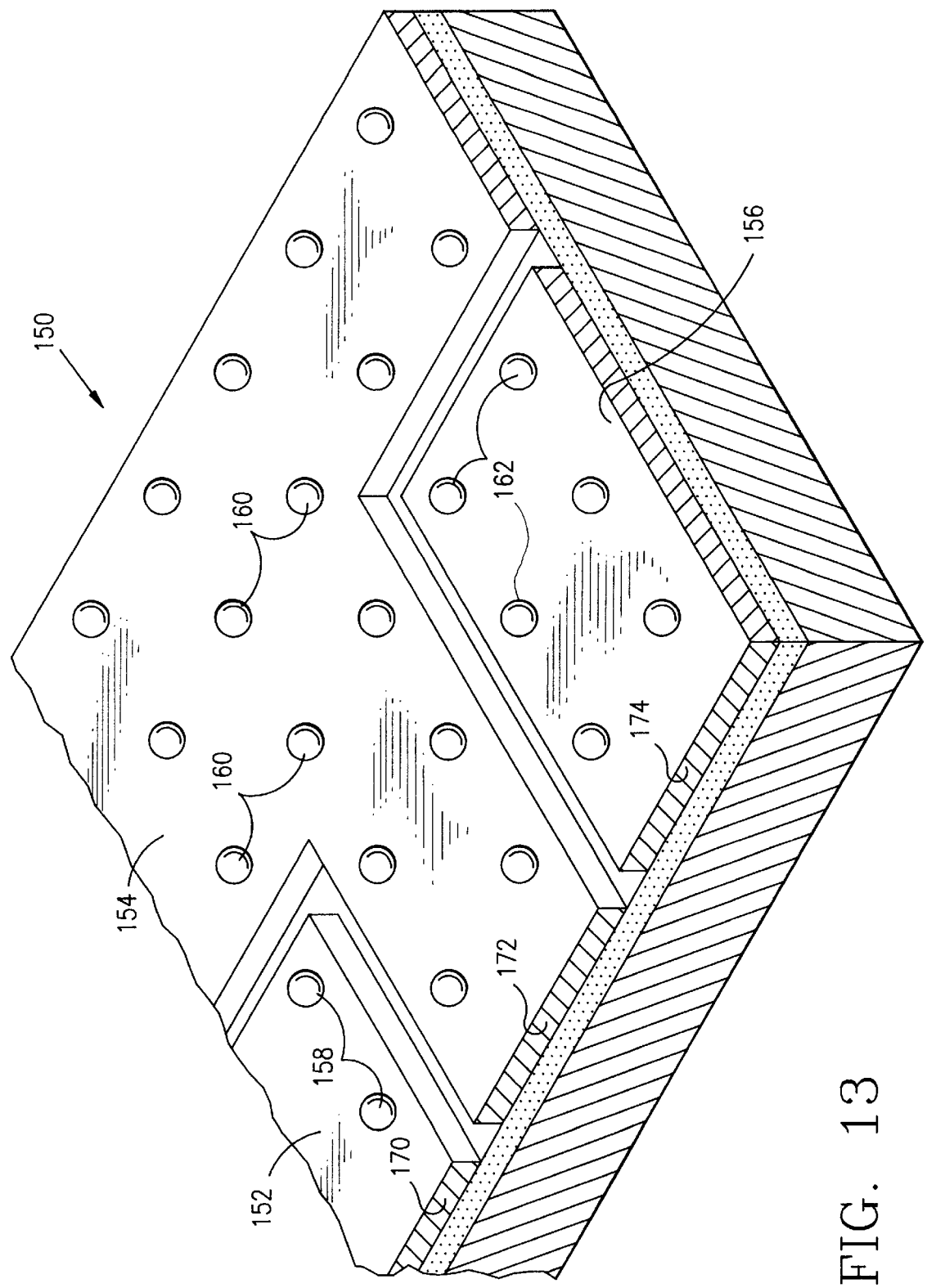
FIG. 13 illustrates a light emitting array divided into plural color regions, in accordance with the present invention.

Following the processes described above, a wafer 150 (FIG. 13) may be fabricated to incorporate three or more regions, or zones, such as the regions 152, 154, and 156, each incorporating a plurality of light emitters, such as emitters 158 in region 152, emitters 160 in region 154, and emitters 162 in region 156. All of the emitters may be of the same material, and thus emit light at the same wavelength to provide a monochromic image which is controlled by the bias voltages applied to electrode layers 170, 172 and 174 in the respective regions 152, 154 and 156. In such a case, each of these regions may be referred to as a "pixel" of light, with the multiplicity of light emitters in each pixel providing redundancy. If desired, a plurality of such sections can be designated as a pixel, with the number of sections energized at a given time determining how many groups of emitters in the pixel are energized, and thus providing control of the intensity of the emitted light from that pixel.

As an alternative, each of the regions 152, 154, 156, etc., can be selectively masked during the growth of the light emitting structures to provide a different optically active material in each region. This will produce a different color emission from each region. Thus, for example, during growth of the light emitting structures 158, the regions 154 and 156 would be masked, in conventional manner. Upon completion of structures 158, a second masking step would cover regions 152 and 156, for example, and the emitter tips in region 154 would be exposed for growth of the light emitters 160. Finally, in a third masking step, regions 152 and 154 would be masked and the emitter tips in region 156 would be exposed for growth of the light emitters 162. By designating a group of three different regions 152, 154, and 156 as a pixel, and by controlling energization of selected emitters, a color-controlled pixel is obtained. Again, by utilizing a multiplicity of regions for each color, the intensity of the emitted light can also be controlled. Because of the close spacing between adjacent emitters available through the fabrication of nanometer-scale emitters using the lateral oxidation process described above, and the resultant large number of emitters that can be provided in a given region, high resolution color images are obtained.

Although the present invention has been described in terms of preferred embodiments, it will be apparent to those of skill in the art that variations and modifications may be made without departing from the true spirit and scope thereof as set forth in the following claims.

What is claimed is:

1. A light emitter, comprising:
    a substrate;
    a nanometer-scale emitter integral with said substrate; and
    an optically active light-emitting material on said emitter.

2. The light emitter of claim 1, further including means for exciting said emitter to cause said optically active material to emit light.

3. The light emitter of claim 1, further including means applying a bias voltage between said optically active material and said substrate to cause said optically active material to emit light.

4. The light emitter of claim 1, wherein said substrate is silicon.

5. The light emitter of claim 1, wherein said optically active material is a direct bandgap material.

6. The light emitter of claim 5, wherein said optically active material is a p-n junction semiconductor.

7. The light emitter of claim 6, wherein said substrate is single crystal silicon.

8. The light emitter of claim 7, wherein said emitter has a diameter of about 20 nm.

9. The light emitter of claim 5, wherein said optically active material is a p-type semiconductor.

10. The light emitter of claim 9, wherein said substrate is silicon.

11. The light emitter of claim 10, wherein said emitter has a radius of about 10–20 nm.

12. The light emitter of claim 1, wherein said substrate is a movable, released microelectromechanical structure.

13. The light emitter of claim 1, wherein said emitter comprises an array of emitter tips integral with said substrate.

14. The light emitter of claim 13, wherein said array of tips comprises a flat panel display.

15. The light emitter of claim 14, further including means to excite selected emitter tips to produce a display image.

16. The light emitter of claim 13, further including means to excite selected groups of emitter tips to produce a display image.

17. The light emitter of claim 16, wherein said optically active material on each emitter of said array of emitters is selected to produce light of a predetermined wavelength upon excitation of corresponding emitters.

18. The light emitter of claim 16, wherein groups of said emitter tips incorporate different optically active materials to emit different wavelengths of light upon excitation of corresponding emitters to thereby provide a color display image.

19. The light emitter of claim 1, further including a metal contact for said optically active material and interconnect means on said substrate electrically connected to said contact.

20. Nanometer-scale light emitters for optical displays, comprising:
    an array of micromachined field emitters on a generally planar surface, each emitter having a tip having a radius of curvature of about 10 to 20 nm, adjacent tips being spaced apart by at least about 3–6 $\mu$m;
    an individual optically active, light-emitting material on each said emitter tips to produce a direct bandgap compound semiconductor on each tip; and
    a voltage source connected to said array for energizing the compound semiconductor on selected individual tips to cause said light-emitting material on the selected tips to become light emitting, the color of the light emitted from each tip being dependent on the material on the corresponding tip.

21. The emitters of claim 20, wherein said tips are single crystal silicon and said material on each tip is grown on said silicon.

22. The emitters of claim 21, further including a partial metal layer on each tip and an interconnect providing a conductive path for connecting said voltage source to a tip.

23. The emitters of claim 22, wherein said material provides a p-type direct bandgap structure on each tip, whereby said voltage source produces field emission from the tip into a conduction band of the compound semiconductor on the tip, band-to-band recombination causing emission of light from said material.

24. The emitters of claim 22, wherein said compound semiconductor forms a direct bandgap p-n junction on said tip, said voltage source being connected to provide a forward bias to said semiconductor to produce carrier injection and recombination to emit light.

25. The emitters of claim 22, wherein said material forms an undoped direct bandgap semiconductor, said voltage source being connected to produce a high forward bias to produce field emission followed by thermalization and recombination.

26. The emitters of claim 22, wherein said light emitting material is selected to produce red, green or blue light emissions from corresponding sets of tips in said array.

27. The emitters of claim 26, wherein each of said sets of tips comprises multiple tips carrying the same light-emitting material to produce a corresponding color pixel.

28. The emitters of claim 22, wherein each of said tips is generally cone shaped.

29. The emitters of claim 22, wherein each said tip has a diameter sufficiently small to cause the lattice structure of the silicon to deform during application of said light-emitting material.

30. The emitters of claim 20, further including a gate for each tip.

31. The emitters of claim 20, wherein said array is mounted on a substrate for an image display.

32. The emitters of claim 20, wherein said voltage source is controllable to cause selective light emission from said emitters to control the color and intensity of light emitted from said array.

* * * * *